United States Patent [19]
Ovshinsky et al.

[11] Patent Number: 5,124,310
[45] Date of Patent: Jun. 23, 1992

[54] LASER ABLATION METHOD FOR DEPOSITING FLUORINATED Y-BA-CU-O SUPERCONDUCTING FILM HAVING BASAL PLANE ALIGNMENT OF THE UNIT CELLS DEPOSITED ON NON-LATTICE-MATCHED SUBSTRATES

[75] Inventors: Stanford R. Ovshinsky, Broomfield Hills; Rosa Young, Troy, both of Mich.

[73] Assignee: Energy Conversion Devices, Inc., Troy, Mich.

[21] Appl. No.: 570,190

[22] Filed: Aug. 20, 1990

[51] Int. Cl.$^5$ .............................. H01L 39/12
[52] U.S. Cl. ....................... 505/1; 505/731; 505/780; 427/531; 427/62
[58] Field of Search ................ 505/1, 731, 780; 427/53.1, 62

[56] References Cited

PUBLICATIONS

L. Lynds et al. "Superconducting thin films of Y-Ba-Cu-O produced by neodymium: ytrium aluminum garnet laser ablation", Appl. Phys. Lett., vol. 52 (4) pp. 320-322, Jan. 25, 1988.

A. M. DeSantolo et al. "Preparation of high $T_c$ and $J_c$ films of $Ba_2YCu_3O_7$ using laser evaporation of a composite target containing Baag37 $F_2$", Appl. Phys. Lett., vol. 52 (23) pp. 1995-1997, Jun. 6, 1988.

Primary Examiner—Shrive Beck
Assistant Examiner—Benjamin L. Utech
Attorney, Agent, or Firm—Marvin S. Siskind; David W. Schumaker; Marc J. Luddy

[57] ABSTRACT

A thin film, fluorinated, ceramic defect-oxide type superconducting material grown on a substrate such as sapphire or stainless steel. The superconducting material is characterized by basal plane alignment of the unit cells thereof even though the substrate does not possess a perovskite-type lattice structure. A laser ablation technique is used to evaporate material from a fluorinated pellet of target material to deposit the fluorinated superconducing material on the substrate, which is heated during the deposition process. The instant invention provides for a low pressure and relatively low temperature method of depositing a superconducting film which is characterized by (1) a minimal number of high angle grain boundaries typically associated with polycrystalline films, and (2) aligned a, b, and c axes of the unit cells thereof so as to provide for enhanced current carrying capacities. Further, the method of this invention provides for the deposition of superconducting material without a post deposition anneal. Large area, irregularly shaped rolls of inexpensive substrate material can be uniformly covered by the method described herein.

17 Claims, 9 Drawing Sheets

Bright field TEM micrograph of an as-deposited epitaxial YBaCuO(F) film on sapphire.

Bright field TEM micrograph of an as-deposited epitaxial YBaCuO(F) film on sapphire.

Bright field TEM micrograph of an as-deposited YBaCuO(F) film on sapphire. The top surface of the film was thinned by ion milling process.

LASER ABLATION METHOD FOR DEPOSITING FLUORINATED Y-BA-CU-O SUPERCONDUCTING FILM HAVING BASAL PLANE ALIGNMENT OF THE UNIT CELLS DEPOSITED ON NON-LATTICE-MATCHED SUBSTRATES

FIELD OF THE INVENTION

The instant invention relates generally to superconducting materials, and more particularly to thin films of fluorinated, high $T_c$, perovskite-type superconducting materials deposited on non-perovskite substrates and which materials are characterized by a-b axis (basal plane) as well as c-axis alignment of the unit cells thereof. Utilizing the technique described herein, it for the first time becomes possible to continuously deposit device quality "epitaxial-like", superconducting films on large area as well as elongated, flexible, inexpensive substrates for high field and other device applications.

BACKGROUND OF THE INVENTION

The attainment of high-temperature superconductivity with a new class of superconducting materials was of immense scientific and technological importance. Many members of this new class of superconducting materials belong to the family of ceramics called "perovskites", which perovskites are generally described by the formula $ABX_3$ and consist of cubes made up of three distinct elements which are present in a 1:1:3 ratio. The perovskite structure is similar to the naturally occurring calcium titanate structure, $CATiO_3$, characterized by at least one cation much larger then the other cation or cations. Also included in this family of ceramics are the tungsten bronzes, $NaWO_3$, strontium titanate, barium titanate, $YAlO_3$, $LaGaO_3$, $NaNbO_3$, $KNbO_3$, $KMgF_3$, $NKiF_3$ and $KZnF_3$, among others. In the perovskite structure the larger ions ($La^{+3} = 1.15$ angstroms, $Ba^{+2} = 1.35$ angstroms and $O^{+2} = 1.40$ angstroms) form a cubic close packed structure, with the smaller ions ($Cu^{+2}$ 0.96 angstroms, $Y^{+3} = 0.09$ angstroms) occupying octahedral interstices in an ordered pattern. Together they form a cubic close packed (face centered cubic) array.

In late 1986, the superconducting properties of certain ceramic defect oxide type materials, which materials are variations of the perovskite class of inorganic structures, were observed by Bednorz and Mueller. The Bednorz and Mueller work was based upon materials developed by Michel and Raveau. The materials which Bednorz and Mueller observed contained lanthanum, barium, copper, and oxygen, and were reported to be superconducting at a temperature of about 30 degrees Kelvin. Continued work in the field resulted in the increase of the critical temperature, $T_c$ (the temperature at which electrons or holes are able to move through a material without encountering any resistance to that motion), by the substitution of yttrium for lanthanum. Upon analysis, the superconducting composition was found to be a perovskite ceramic defect oxide of the $Y_1Ba_2Cu_3O_7$ type, an orthorhombically distorted perovskite. Further work with this phase effectively raised the critical temperature to a few degrees above 90 degrees Kelvin (a temperature above the atmospheric boiling point of liquid nitrogen).

The ceramic defect oxide perovskite phase, having the general composition $M_7^{IIIA}M_2^{IIA}M_3^{IB}O_y$, was identified utilizing electron microprobe analysis, x-ray diffraction, scanning electron microscopy, and transmission electron microscopy. This ceramic defect oxide perovskite, $M_1^{IIIA}M_2^{IIA}M_3^{IB}O_y$, phase was characterized as having a recurring crystallographic unit cell structure including substantially parallel a and b planes spacedly disposed along and substantially parallel to the c-axis thereof.

More specifically, the central plane is a plane of the $M^{IIIA}O$ type, as a Y-O or La-O plane, with the Group IIIA Metal being surrounded at its four coplaner corners by oxygen sites, which may be occupied or vacant. Immediately above and below this $M^{IIIA}$-O plane are equivalent $M^{IB}$-O planes of the second type, i.e., Cu-O planes, which the Group IB metal ions being at the four corners of the plane and occupied oxygen sites being along each edge of the planes. These square planar $M^{IB}$ atoms (or ions), each surrounded by four oxygen atoms (or ions) have been reported to be critical to superconductivity in the defect oxide perovskites. A pair of $M^{IIIA}$-O planes, as Ba-O planes lie atop and below these fully occupied first type $M^{IB}$-O planes. The $M^{IIIA}$-O planes, formed with the Group IIA metal, as barium, at the center have fully occupied oxygen sites, with the oxygens disposed directly above and below the Group IB metal sites of the adjacent planes. The $M^{IIA}$-O planes are disposed between $M^{IB}$-O planes, as shown in FIG. 1, with the first type $M^{IB}$-O planes disposed on opposite sides thereof relative to the second type $M^{IB}$-O planes. As mentioned above, the vacancies (unoccupied sites) reported to reside in the first type $M^{IB}$-O planes are the result of the requirement of electrical neutrality. While the vacancies are generally reported to be in the $M^{IB}$-O planes, they may also be in the other planes, as in the $M^{IIA}$-O planes. IN fact, oxygen is totally absent in the (yttrium) planes.

The superconducting perovskite type materials are ceramic based defect oxides. That is, the superconducting phases of the perovskite type materials are solids in which different kinds of atoms occupy structurally equivalent sites, and where, in order to preserve electrical neutrally, some sites are unoccupied, or vacant. Since these vacancies may be filled with mobile oxygen atoms, only local order is prevalent with periodicity existing along the planes. These vacant sites form lattice defects, which defects have, generally, profound affects upon the electrical parameters of the superconducting material and more particularly upon the oxidation states of the copper atoms in the unit cells thereof.

Heretofore, single crystal superconducting perovskite type films could only be grown on a "template", i.e., an underlying substrate of substantially the identical crystallographic lattice structure as that of the superconducting film. The superconducting film deposited on this template is thereby epitaxially grown according to the lattice structure of the substrate. Materials, such as strontium titanate and lanthanum aluminate, which have lattice structures matched to the lattice structures of perovskites, are thus utilized as preferred substrates for the epitaxial growth of superconducting perovskite ceramic-oxide type films. However, because these perovskite substrates are very expensive and provide limited surface area upon which to deposit superconducting material, they have no practical commercial importance.

Typically, the non-epitaxially grown superconducting perovskite ceramic defect oxide-type films are polycrystalline in nature, formed i.e., of a individual superconducting grains columnarly arising from the underlying substrate (See FIG. 10). In prior work, efforts of the instant inventors at aligning these individual grains have resulted in spatial alignment only along the c-axis of the unit cells thereof (See commonly assigned and pending U.S. patent application Ser. No. 442,380 filed on Nov. 28, 1989, entitled "Method of Aligning Grains of a Multi-Grained Superconducting Material", the disclosure of which is incorporated herein by reference.). While such c-axis alignment provided increased current flow as compared to randomly oriented superconducting material, it failed to provide the high current carrying capacity originally anticipated. While the reasons that c-axis alignment of the unit cells of the superconducting material failed to provide high current carrying capacity will be detailed in subsequent paragraphs, a perusal of FIG. 10 demonstrates the type of columnar growth present in typical polycrystalline superconducting material characterized by such c-axis orientation. It should be immediately apparent to the reader that current flowing along the a-b plane cannot travel very far before encountering the grain boundaries separating adjacent crystallites, which grain boundaries effectively restrict current flow thereacross.

The instant inventors also previously disclosed $Y_1Ba_2Cu_3O_7$ superconducting films which were modified by the addition of a "parametric modifier" element to fill structural vacancies. (See commonly assigned U.S. patent application Ser. No. 043,279 filed Apr. 27, 1987, now abandoned and entitled "Parametrically Modified Superconductor Material", the disclosure of which is incorporated hereinto by reference.) These researchers at Energy Conversion Devices, Inc. realized that in order to achieve yet higher critical temperatures, it would be necessary to develop a superconducting material in which the chemistry thereof was engineered so as to alter the local chemical and electrical environment. For example, it has been established that the mobility of oxygen atoms in the $Y_1Ba_2Cu_3O_7$ ceramic based systems is very high and therefore the location of those mobile oxygen vacancies at any point in time contribute to the presence or absence of high $T_c$ superconducting phases. It is this oxygen mobility and changing local environment which results in the unstable electronic properties of this class of superconducting materials. The addition of the very small and highly electronegative fluorine atoms was found to effectively occupy lattice sites in the ceramic based fluoro-oxide class of superconducting materials so as to cause "grid lock" and provide an impediment to the mobility of oxygen atoms. The result was a stabilized high critical temperature superconducting material. Zero resistance evidence was provided of superconducting phases in "modified" materials as high as 155 to 168 Kelvin. Magnetic measurements also indicated the presence of yet higher temperature superconducting phases of said fluorinated superconducting material. The instant disclosure continues to refer to the "parametric modifier" as an agent capable of modifying the local environmental and/or the local chemistry of the superconducting material in such a manner as to affect one or more parameters which control the level of the critical temperature of the superconducting phase. The parametric modifier may also act to affect the interaction between the otherwise shielded orbitals of adjacent atoms of the unit cell, in particular the d orbitals. The parametric modifier can act to produce changes in certain parameters which positively effect the critical temperature, while avoiding otherwise related adverse changes in other parameters which would negatively affect the critical temperature. Thus, normally dependent parameters are uncoupled from one another allowing for human engineering of critical features. The parametric modifier can also serve as a catalytic agent to promote grain alignment and to promote film growth along the a-b basal plane. In summary, fluorine, the parametric modifier element, can act in at least one of three ways to improve superconducting properties in the perovskite, defect oxide class of high $T_c$ materials: (1) fluorine can be incorporated in the superconducting material itself; (2) fluorine can act in the plasma to organize the deposition of the superconducting material; and/or (3) fluorine can promote basal plane growth and inhibit c-axis growth.

The ability for high $T_c$ superconducting materials to carry high critical current densities is not only of great scientific importance but has immense economic significance. Initially, researchers were not sure of the current density carrying capabilities of the high critical temperature phases of these high $T_c$ superconducting materials. However, this doubt was resolved by scientists at various laboratories throughout the world who demonstrated experimentally that the high $T_c$ ceramic defect oxide superconducting materials could carry current densities exceeding $10^6$ amperes per square centimeter at 77K. This was determined by measuring the current density carried by either a single crystal or epitaxially grown thin film of $Y_1Ba_2Cu_3O_7$ material in a direction of movement parallel to the a-b plane, i.e., perpendicular to the c-axis of the unit cell thereof. However, the single crystal and the epitaxial thin film were found to be strongly anisotropic and could only carry about 10,000 amperes per square centimeter of current in a direction other than along said basal planes.

These experiments indicate that the high $T_c$ grains of the polycrystalline superconducting material of the $Y_1Ba_2Cu_3O_7$ class are highly unaligned and the current density is limited by the high angle grain boundaries which result from columnar growth of relatively small grains. This is contrary to previous thinking that the alignment of the grains of the polycrystalline superconducting material only along the c-axis, vis-a-vis, the basal plane, would be sufficient to produce materials having high current carrying capacities. It is now clear that alignment of the unit cells in the a-b direction as well as the c-direction of the superconducting material is required in order to obtain an aligned current path and provide a superconducting material capable of carrying high current densities.

The extremely anisotropic nature of the high temperature superconducting materials, where the current flows preferentially along the Cu-0 plane, and the strong chemical reactivity of the material have been the major stumbling blocks in the commercial development of high $T_c$ superconducting materials. It is clear that, randomly oriented polycrystalline film, tape or wire cannot be utilized to carry the current densities necessary for most commercial applications. Up to now, the high current carrying capability of the high $T_C$ superconducting materials has only been demonstrated with tiny single crystals or on films epitaxially grown on perovskite substrates characterized by a lattice mismatch of less than 2%, such as $SrTiO_3$, $LaAlO_3$, $LaGaO_3$, etc. However, these substrates are too costly for use in the fabrication of commercial devices, are available only in small wafers, and possess high dielectric constants and high dielectric losses. Further, such free standing single crystal superconducting materials are many times, inherently brittle and inflexible. Accordingly, flexible, epitaxial-like films grown on inexpensive substrates must be utilized in order to make it commercially feasible to fabricate wire or other flexible superconducting material. In numerous commercial applications, it is necessary that the superconducting material be grown on top of a metallic, highly conductive substrate, such as copper, silver or gold, to avoid a catastrophic failure in the event the superconducting material reverts back to its normal state.

Therefore, an urgent and long felt need has existed for a method of growing single, epitaxial or epitaxial-like thin films of flexible high $T_c$ superconducting material on inexpensive non-perovskite substrates, especially if those superconducting films are capable of providing high current carrying capacities and the growth can be accomplished in an inexpensive, roll-to-roll, mass production process. It is to satisfy this crucial and long felt need that the instant invention is directed.

SUMMARY OF THE INVENTION

A new approach to growing a high quality thin superconducting film on commercially viable, i.e., inexpensive, elongated and/or large area substrates is disclosed herein. To deposit device quality "epitaxially" grown high $T_c$ superconducting film, which can carry high critical current densities, on inexpensive, non-perovskite, large area or irregularly shaped substrates, such as $Al_2O_3$, it is crucial (1) to reduce chemical reactivity between the substrate and the superconducting films by reducing the deposition temperature, and (2) to grow superconducting film with unit cell alignment so that current can flow with minimal weak links from the high angle grain boundaries typically present with columnar, polycrystalline films. The instant invention utilizes fluorine as a "parametric modifier" in a laser ablation process to solve these basic problems. It is noteworthy that the laser ablation process disclosed herein is particularly viable for producing high $T_c$ superconducting material because it is an inherently non-equilibrium process. Further, the method described herein, provides for the commercial mass production, roll-to-roll fabrication of high $T_c$ superconducting material on large area and/or inexpensive substrates.

As demonstrated herein, the addition of fluorine as a parametric modifier element significantly increases the alignment of the unit cells along both the c-axis and the basal a-b plane of the perovskite ceramic defect oxide-type superconducting material. This increase in unit cell alignment represents a significant improvement over the random or c-axis alignment reported by other researchers in $Y_1Ba_2Cu_3O_7$ type superconducting materials. As previously mentioned, fluorine plays an important part in cleaning or etching potential nucleation centers from the deposition surface, promoting film growth in the basal plane, as a catalytic agent in organizing preferred chemical arrangements in the plasma and in the bulk of the superconducting material by stabilizing non-equilibrium conditions. In this invention, we concentrate on the fabrication of an analog to a large single crystal, and the ability to fabricate a superconducting film having a very smooth, defect-free outer surface. Further, since the epitaxial growth of the superconducting film covers any impurities present in the depositing film, it is possible to purposely insert magnetic flux pinning centers thereinto. Of the greatest importance, the instant process allows for the growth of epitaxial films without using single crystal growth techniques or substrates having a lattice matched to the lattice of the superconducting film being deposited.

The present researchers have hypothesized that the use of fluorine in the laser ablative growth process can serve to prevent or at least minimize the growth of nucleation sites on either the substrate or the depositing film and hence minimize the columnar growth of individual grains in the superconducting material. The reader must appreciate the fact that if numerous nucleation sites are present, columnar polycrystalline grains are grown and basal plane alignment of those columns becomes impossible. By increasing the a-b axis alignment of the material and eliminating the high angle boundaries inherently present with discrete superconducting grains, the ultimate goal of manufacturing thin film epitaxial superconducting materials onto inexpensive flexible wires and other irregularly and/or large area non-perovskite substrates has been achieved. Fluorine is a well known etching element and by employing a fluorinated target and an optimum power and frequency of laser pulses, nucleation sites can be scavenged from the surface on which the superconducting film is grown, thereby both dramatically decreasing, if not totally eliminating, columnar grain growth and promoting growth in the a-b plane. As a matter of fact, the process is so effective that impurity phases present in the depositing film are ignored by that depositing film and preferential growth continues in the basal plane until those impurities are completely covered. Hence, the term "epitaxial-like" is used herein to define the type of growth disclosed by the instant process. In this regard, specific reference is made to FIG. 11 which is a bright field microphotograph showing the effects of impurity phases in $YBa_2Cu_3O_7(F)$ film. It is particularly noteworthy that the impurity phases interfere with the growth of the superconducting film in the a-b plane, thereby creating large high angle grain boundaries and forcing microns of columnar growth before the depositing film is able to cover those phases. Contrary to FIG. 11, through the practice of the method of the instant invention it becomes possible to deposit thin films of high $T_c$, high current density perovskite ceramic defect oxide-type superconducting material on inexpensive substrates and in a continuous, roll-to-roll process which is ideally suited for mass production.

One inexpensive substrate of choice, sapphire ($Al_2O_3$), has extraordinary dielectric properties and is commonly used in many microelectronic applications. However, because heretofore the $YBa_2Cu_3O_7$ superconducting film has interacted chemically with the sapphire substrate to form an interfacial layer, and because of the large lattice mismatch which exists between the hexagonal structure of sapphire and the perovskite structure of the depositing film, the quality of the superconducting material directly deposited on sapphire was not satisfactory. However, due to the invention disclosed by the present method, sapphire can be utilized to provide an economical and commercially significant substrate. Of course, other perovskite substrates have been employed as scientific curiosities, but due to cost constraints and the small surface areas they provide, those prior art substrates have found no commercial significance. Another inexpensive substrate of choice is silver, which provides a good electrical conductor for preventing catastrophic failures in the event that the superconducting material would revert to its normal state. In this regard, note that of the noble metals, gold is too soft and expensive and copper reacts with the superconducting material, thereby making silver a preferred, inexpensive and flexible substrate. While the aforementioned substrates represent preferred embodiments, note that key features of the instant invention is the elimination of the reliance on substrate material and the deposition of the high $T_c$ epitaxial-like superconducting material on any substrate, without regard to the relative lattice structures thereof.

In a preferred embodiment, the superconducting film of the instant invention is ablated from a target pellet during a laser pulse and is deposited onto a substrate disposed in close proximity thereto. In this embodiment, especially tailored for use with a sapphire substrate, a non-sintered, mutliphased target includes $BaF_2$, $CuO$, and $Y_2O_3$ and is utilized to introduce the necessary elements for epitaxially depositing the fluorinated $YBa_2Cu_3O_7$ superconducting film.

A schematic diagram of the laser ablation system is shown in FIG. 4, said system operatively disposed within an enclosed vacuumized deposition chamber. The target is rotated at a speed of about 10 rpm and non-stoichiometric YBaCuO(F) material is ablated therefrom with pulses from a XeCl excimer laser (lamda=308nm, tau=30ns) fired within an optimized frequency and power regime. For instance, the laser can be fired at a frequency of less than 5Hz and preferably at a frequency of about 0.1-0.3 Hz and at an energy density of less than about $5J/cm^2$ and preferably less than $3J/cm^2$. During the deposition process, the chamber is maintained at an oxygen partial pressure of less than 100 mTorr and preferably at about 25-50 mTorr and the substrate holder is maintained at a temperature of approximately 650° C.-680° C. The substrate, being mechanically clamped to the holder, has a surface temperature 70°-100° C. lower than the temperature of the substrate holder. After the deposition, the sample is slowly cooled to room temperature in about 40 minutes.

By ablating material from a fluorinated, non-stoichiometric, $YBa_{2.7}Cu_{2.6}F_{5.4}O_{4.1}$ target, the high quality perovskite-type expitaxial-like superconducting films are not only characterized by the c-axis of the unit cells thereof oriented perpendicular to the plane of the non-perovskite substrate, but also characterized by basal plane alignment of the unit cells thereof on the bare $Al_2O_3$ or silver substrate without the presence of an interfacial layer therebetween. The superconducting film exhibits excellent normal state metallic properties, a very sharp superconducting transition with a $T_c$ (R=0) of 86-88 K, and a critical current density of $1.5 \times 10^5$ Amps/$cm^2$. Further, the magnetic field dependence of Jc (H)/Jc(O) indicates that the quality of this ablated superconducting film is similar to the quality of epitaxial grown, single crystal superconductors which demonstrates strong flux pinning along the basal plane of up to 10 Tesla.

These and other objects and advantages of the present invention will become apparent from the detailed description of the preferred embodiment of the present invention which follows hereinafter.

DETAILED DESCRIPTION OF THE PREFERRED EMBODIMENT

Figure 1:
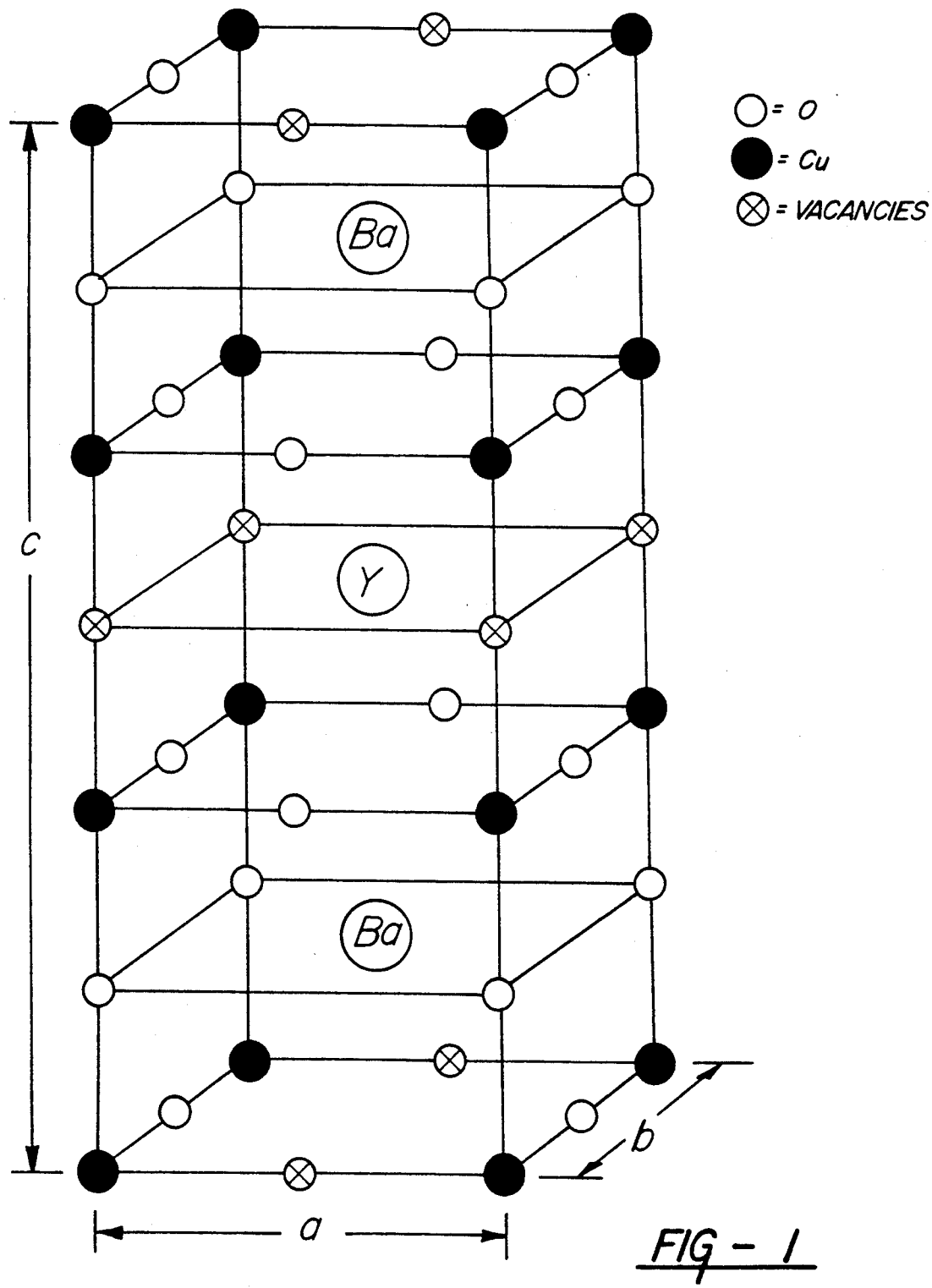
FIG. 1 illustrates the typical unit cell structure of a ceramic based defect oxide, perovskite-type superconducting material characterized by the composition $M_1^{IIIA}M_2^{IIA}M_3^{IB}O_y$, and specifically depicting the oxygen vacancies present in the CuO planes of that unit unit cell.

It is important to controllably introduce an alignment inducing modifier, such as fluorine, into the unit cells of the ceramic based, defect oxide-type, superconducting material so as to occupy either vacant lattice sites or to partially substitute for oxygen atoms in those lattice sites which are otherwise occupied by oxygen atoms in conventionally formed $YBa_2Cu_3O_7$ type material (or both). The chemical introduction of fluorine is theorized to increase the thermodynamic stability of the ceramic based fluoroxide superconducting material, while significantly increasing the alignment of unit cells along the a, b and c-axis of at least the high $T_c$ superconducting phases of the material. The instant inventors have developed a method of introducing the alignment inducing, columnar growth inhibiting, parametric modifier into the high $T_c$ superconducting material through a process, such as laser ablation, that can advantageously be applied to other thin film deposition techniques so as to render it possible to deposit thin film, flexible, high $T_c$ epitaxial-like superconducting material on irregularly shaped substrates having a lattice structure different than the lattice structure of the superconducting film.

The method disclosed in the instant invention relates to a solid state reaction in which the precursor compound of the alignment-inducing parametric modifier element can be introduced either by a metallic or a non-metallic compound containing fluorine; the precursor compound is capable of incorporating fluorine into the perovskite ceramic based defect oxide-type material without otherwise deleteriously effecting the propensity of that perovskite precursor mixture to form a superconducting material. Preferably, the source of the parametric modifier, i.e., the fluorine containing compound, is chemically stable at standard temperature and pressure and is capable of being excited in the laser ablation process first to effuse fluorine atoms or fragments into the deposition environment and, where necessary, to reintroduce at least some fraction of said element into the superconducting material. Note that, as explained hereinabove, it is not necessary that a large atomic percentage of fluorine be incorporated into the superconducting material; but rather that fluorine be introduced into the plasma so as to cleave nucleation sites from the deposition surface and promote basal plane growth, vis-a-vis, columnar growth. It is also possible to substitute a gaseous form of fluorine, atomic, molecular or excited, to at least partially replace the metallic fluorine containing compound without departing from the spirit or scope of the invention.

The laser ablation process induces a solid state reaction to occur between the compounds of the precursor mixture, thereby forming a perovskite ceramic based defect oxide type epitaxially grown superconducting material. Said perovskite defect oxide-type material is represented by the generic formula $M_vIIA_MwIII_{Mx}IB_{Oy}$, wherein $M^{IIA}$ is a Group IIA metal, $M^{IIIA}$ is a Group IIIA metal, $M^{IB}$ is a Group IB metal, O is oxygen, v is approximately 2, w is approximately 1, x is approximately 3 and y is in the range from 5.5 to 9.0.

Laser-assisted evaporation has been previously used to deposit thin films of semiconductors and dielectrics, and more recently to deposit thin superconducting $YBa_2Cu_3O_7$ films. The deposition process utilizes a high power, pulsed laser to ablate material from the face of a target pellet onto a nearby substrate. Conventionally, a target pellet is mounted in the range of 1–8 cm, and preferably 5 cm, from a heated substrate under vacuum (approximately $1 \times 10^{-6}$ Torr) and irradiated by pulsed light from an externally mounted excimer laser. A window in the vacuum chamber allows the excimer beam to irradiate the target. The excimer beam is focused through a cylindrical lens to produce peak power intensities of about 200 MW/cm². The high local fields produce a plasma at the surface of the target pellet and a visible plume of excited ejected particles extending toward the substrate. Typical thicknesses of the deposited superconducting film range from about 0.1 to 3.0 micrometers, with deposition rates ranging from about 0.1 to 10 Angstroms per laser pulse. The substrate is heated to allow surface mobility of the depositing species while limiting oxygen out-diffusion. After deposition, most films require conventional annealing in an oxygen atmosphere to become metallic and superconducting.

In the preferred embodiment of the present invention, the process remains essentially the same; however, the pressure is maintained relatively low and a pulse/frequency power regime is optimized so that the fluorine atoms and radicals have optimal time and energy to etch the deposition surface of nucleation centers and promote film growth in the basal plane. Preferably, the pressure is maintained in the range of about 25 to 50 mTorr and the frequency between laser pluses is maintained at less than about 5 Hz and preferably between about 0.1 to 3 Hz. As a matter of fact, the instant inventors have discovered that too high a combination of energy and frequency prevents fluorine from etching nucleation sites from the deposition surface and enables columnar growth of polycrystalline material to begin.

Figure 4:
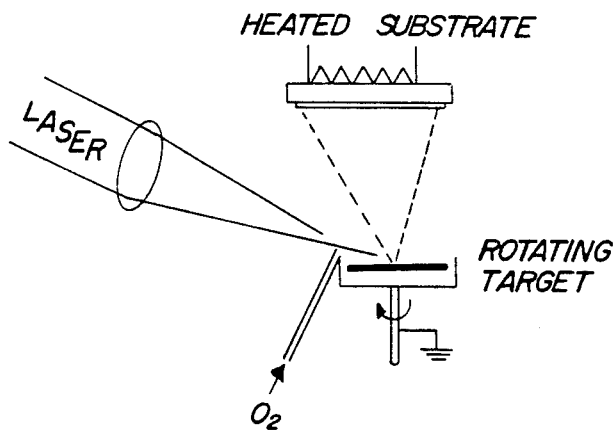
FIG. 4 is a schematic representation of the laser ablation system used in one embodiment of the present invention, said representation illustrating the relative disposition of the major components of the system employed in the fabrication process.
Figure 6:
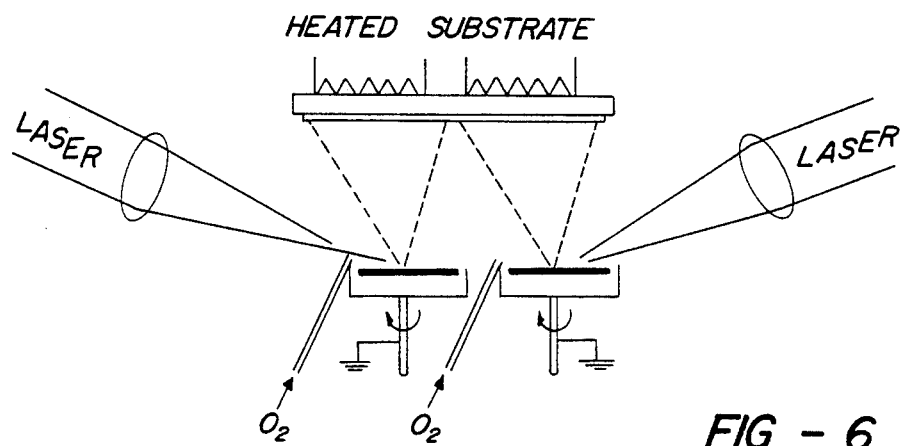
FIG. 6 is a schematic representation of the laser ablation system used in a third embodiment of the present invention in which a plurality of target/laser systems are utilized to deposit uniform films of different superconducting material atop large area or irregularly shaped substrates.
Figure 5:
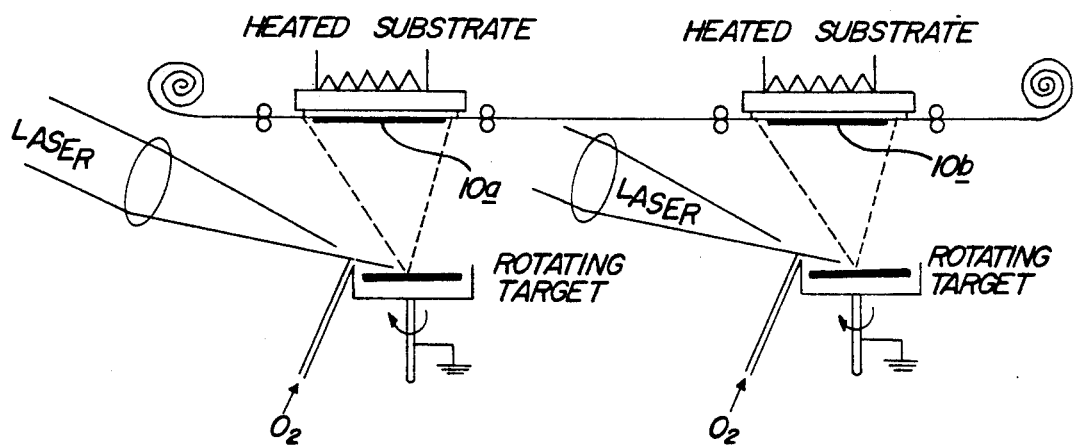
FIG. 5 is a schematic diagram of the laser ablation system used in a second embodiment of the present invention, said representation illustrating a roll-to-roll process in which an elongated roll of substrate material is continuously moved through the deposition region.

As shown in FIGS. 4–6, several types of laser ablation systems can be utilized in practicing the invention described herein. Of course, the type of system is dependent, at least in part, on the dimensions and shape of the substrate. Typically, the effective deposition region produced by laser ablating a single, 1 inch diameter target pellet is approximately 2 cm². For a small single substrate, a system having only one target pellet, as shown in FIG. 4, is sufficient. For relatively thin, continuous rolls of substrate material, such as wire or tape, a system in which the roll of substrate material is continuously advanced through the deposition region to have uniform continuous flexible superconducting films deposited thereon, as shown in FIG. 5, can be employed. In a particularly important embodiment of FIG. 5, the substrate is a thin roll of silver coated wire upon which 1 to 3 microns of flexible superconducting material is continuously deposited. Because of the continuous movement of the wire through the deposition region, the deposited material will be very uniform. Note that it is possible to employ multiple laser assemblies to deposit a thicker coating of superconducting material as the elongated wire sequentially or continuously moves past the multiple deposition regions. For instance, the roll of substrate material might include silver coated regions such as 10a and 10b which are sequentially coated as the roll moves therepast. The multiple systems can be spacedly disposed in a single chamber or in discrete chambers.

Further, a multiple number of spacedly disposed targets can be simultaneously ablated (as shown in FIG. 6) by a respective number of multiple lasers to increase the effective deposition area for depositing superconducting material onto irregularly shaped or larger area substrates. Different targets could be fabricated from different superconducting, metallic or insulating materials so that actual devices or alternating layers could be formed in a continuous or sequential movement of substrate material through one or more deposition regions. Also note that while the foregoing discussion centered about a single roll of substrate material, multiple discrete substrates could also be sequentially passed through the deposition region without departing from the spirit or scope of the invention. For instance, cassettes of discrete substrates could be introduced into the vacuum chamber and processed in the aforedescribed manner. The aforedescribed deposition techniques of the instant invention can be employed to grow thick epitaxial-like high $T_c$ superconducting films on flexible substrates for large volume high field applications. In this connection, note that randomly oriented polycrystalline films could not provide the current density required for such device applications. Also note that the use of a high quality electrically conducting substrate is advantageous so that catastrophic failures are prevented in the event the superconducting film returns to its normal state.

EXAMPLE

A sample of the perovskite defect oxide type of superconducting material comprising metal species and oxygen in combined form was prepared in a parametrically modified, fluorinated state. Thereafter, through the use of the aforementioned laser ablation technique, a superconducting film was produced from material evaporated from the sample. The properties of the superconducting fluorinated film were subsequently compared to a superconducting film similarly fabricated non-fluorinated sample to determine the effect of the parametric modifier in the perovskite ceramic defect oxide type materials under identical conditions of deposition.

The fluorinated sample of superconducting material was initially prepared by blending specifically selected compounds to form a perovskite defect oxide type precursor mixture. Specifically, the precursor mixture contained the following compounds, which were weighed out on paper in the following proportions, and were poured into an unglazed, Coors CH-50-65504-7 crucible, as follows:

| POWDER | ACTUAL WEIGHT | SOURCE |
| --- | --- | --- |
| $Y_2O_3$ | 2.8496 grams | Metals Mart. Lot R4, (5–6 nines purity) |
| $BaF_2$ | 11.9376 grams | Alfa Ultrapure. Lot 050385 |
| CuO | 5.2159 grams | Metals Mart. Lot 2688, (3 nines purity) |
| TOTAL | 20.0031 grams | |

The mixture of the perovskite precursor materials was blended with a pestle in the unglazed crucible, packed into the bottom of the crucible, and then heated in air at standard pressure in a preheated 930° C. furnace. At various intervals, the mixture was removed from the furnace, cooled, and reground to ensure thorough blending of the mixture compounds, and then reinserted into the 930° C. furnace, according to the following time regime:

| | TIME | ACTIVITY |
| --- | --- | --- |
| | 19 Hours, 52 minutes | 930° C. furnace removed, cooled, reground |
| | 4 Hours, 40 minutes | 930° C. furnace removed, cooled, reground |
| | 17 Hours, 4 minutes | 930° C. furnace removed, cooled, reground |
| | 6 Hours, 32 minutes | 930° C. furnace |
| TOTAL | 48 Hours, 8 Minutes | |

After the foregoing regime of heating was completed, a ten gram sample of the mixture was pressed into a pellet-like configuration for use in the laser ablation equipment. Ten grams of the compound mixture was weighed and that amount was inserted into a drill stock die and compressed in stages to form a pellet. The stages of compressing the mixture into a one inch diameter pellet occurred as follows:

| PRESSURE | TIME |
| --- | --- |
| 5 Tons | momentarily |
| 10 Tons | momentarily |
| 15 Tons | momentarily |
| 20 Tons | five minutes |

After being compressed according to the above schedule, the pellet showed no visible signs of cracking. The pellet was then subjected to a sintering process, wherein the pellet was placed on $YBa_2Cu_3O_7$ bars, loaded onto an alumina carrier, and heated in an extra dry oxygen furnace, having an $O_2$ flow rate of 1 cc per second, at ambient pressure of 100 mTorr, according to the following schedule:

| TIME | TEMPERATURE |
| --- | --- |
| 12 Hours | Ramped from 200° C. up to 950° C. |
| 16 Hours | 950° C. |
| 8 Hours | Ramped from 950° C. to 200° C. in situ |

After completion of the sintering process, the pellet was removed, stored in a dessicator and finally subjected to the laser ablation process.

Figure 9:
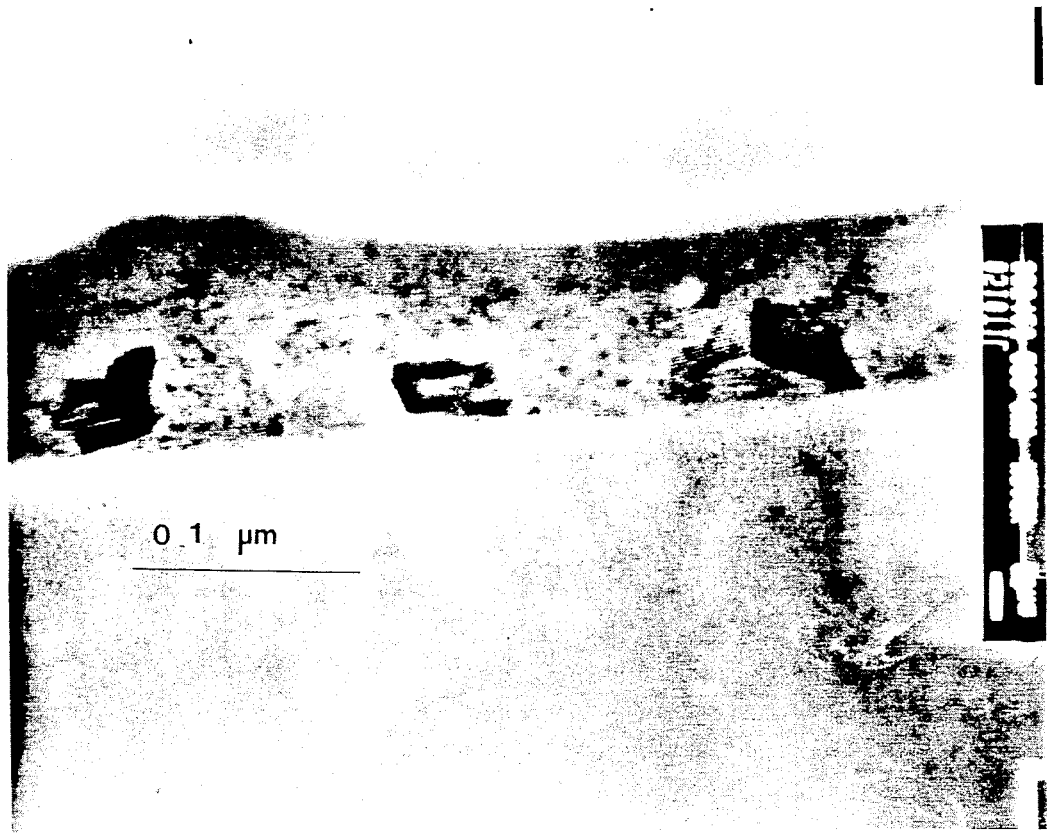
FIG. 9 is a bright field TEM cross-sectional microphotograph of an as-deposited epitaxial-like fluorinated $YBa_2Cu_3O_7$ superconducting thin film of the instant invention.
Figure 11:
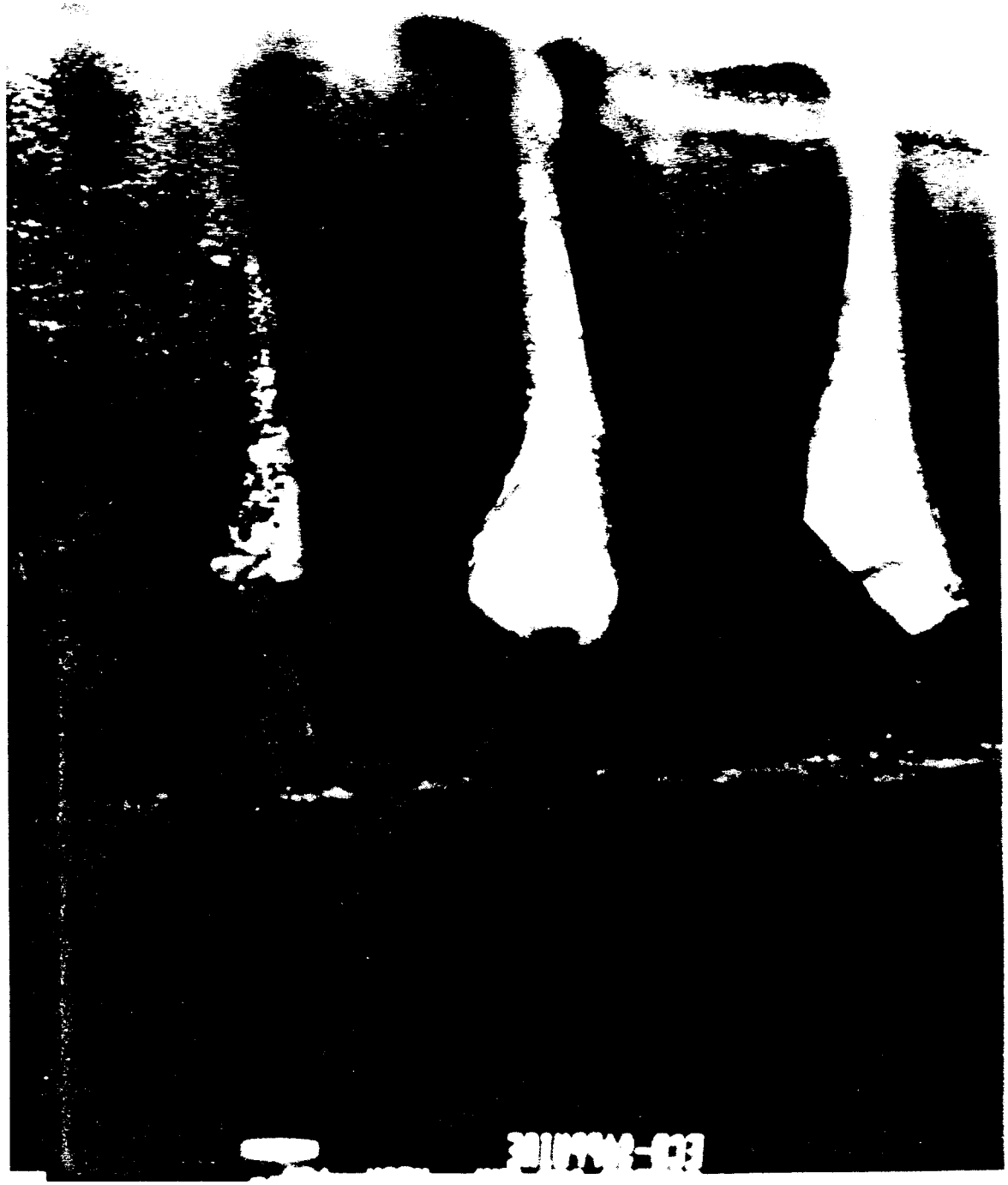
FIG. 11 is a bright field TEM cross-sectional microphotograph of an as-deposited polycrystalline fluorinated $YBa_2Cu_3O_7$ superconducting film of the prior art and illustrating the effect of impurity phases incorporated into the bulk of the depositing film.

The epitaxial-like superconducting films were prepared using the aforementioned laser ablation technique. Note that the term "epitaxial-like", as used herein, refers to the type of growth of high $T_c$ superconducting ceramic defect oxide-type material experienced on non-perovskite substrates, i.e., substrates whose lattice structure is not matched to the lattice structure of the superconducting material. This type of epitaxial growth can best be understood by referring to the bright field TEM microphotograph of FIG. 9 which illustrates the $YBa_2Cu_3O_7$ superconducting film grown on a sapphire substrate. As can be seen from a perusal of that microphotograph, no crystallites, high angle grain boundaries or columnar grain growth is present. The film growth is virtually indistinguishable from and analogous to true single crystal epitaxy on perovskite substrates. There is practically no interfacial barrier layer between the substrate and the deposited superconducting film. Note the presence of the impurity phases adjacent the substrate/superconducting material interface. The complete encapsulation of those impurity phases and the growth of the superconducting material thereabout gives rise to a most interesting, unique and synergistic result. This totally unexpected result is that the depositing film grows as though the impurity phases were not even there. Indeed, the surface grows to a mirror-like finish, without the presence of any cracks due to the strain relief inherently provided by the process of the instant invention. Contrary to the impediment to epitaxial growth illustrated in FIG. 11, the impurity phases illustrated in FIG. 9 fail to impede epitaxial growth of the superconducting film. Again, the instant inventors believe this phenomena is due to the etching behavior of fluorine atoms and radicals which scavenge nucleation centers from the exposed surface, thereby not only preventing columnar grain growth, but promoting film growth in the basal plane.

The sintered target, having multiphase components of $BaF_2$, $CuO$ and $Y_2O_3$, was positioned in a conventional vacuumized chamber (not illustrated), rotated at 10 rpm and material ablated therefrom with pulses from a XeCl excimer laser (lamda=308nm, tau=30ns) fired at about 0.3 Hz. The laser energy density was maintained at about $3J/cm^2$. During the deposition process, the chamber was maintained at an oxygen partial pressure of 50mT and the substrate holder was maintained in the range of about 650° C. to 680° C. The sapphire substrate, being mechanically clamped to the holder, has a surface temperature of 70°-100° lower than the temperature of the substrate holder. Due to the lower temperature of the substrate surface, a sapphire substrate may be employed without the elements thereof chemically reacting with the elements of the fluorinated $YBa_2Cu_3O_7$ superconducting material. Following the deposition process, the sample was slowly cooled to room temperature in approximately 40 minutes.

The sample film of superconducting material so produced was thereafter tested to determine the effect of the parametric modifier, fluorine, in the aforedescribed process. This testing generally compared the fluorinated $YBa_2Cu_3O_7$ superconducting film of the instant invention to conventional polycrystalline, non-fluorinated films of superconducting $YBa_2Cu_3O_7$ material on perovskite substrates.

The electrical transport properties of the resulting fluorinated ceramic defect oxide-type superconducting film was measured by a standard four-probe dc measurement. The critical current density was measured on a $0.2\times2$ mm line defined by a laser scribing technique. The quality of the superconducting film and the interfacial reactions thereof with the substrate were studied using a JEOL 2000FX analytical electron microscope equipped with a Kevex Quantum light element x-ray detection system. Cross-sectional specimens were prepared by bonding two slices of the substrate and superconducting film together with epoxy so that the film sides were operatively disposed in face to face relation. This was followed by mechanical polishing, dimpling and argon ion milling with liquid nitrogen cooling. The critical current density carried by the standard superconducting $YBa_2Cu_3O_7$ film and the fluorinated superconducting film, measured at 77K on a laser patterned stripe of $0.2\times2$ mm, are $5\times10^3$ and $1.5\times10^5$ $A/cm^2$, respectively. In other words, the fluorinated ceramic defect oxide-type superconducting film, prepared in the aforementioned manner, showed an increased currently density of over $3\times10^2$ $A/cm^2$.

Figure 2:
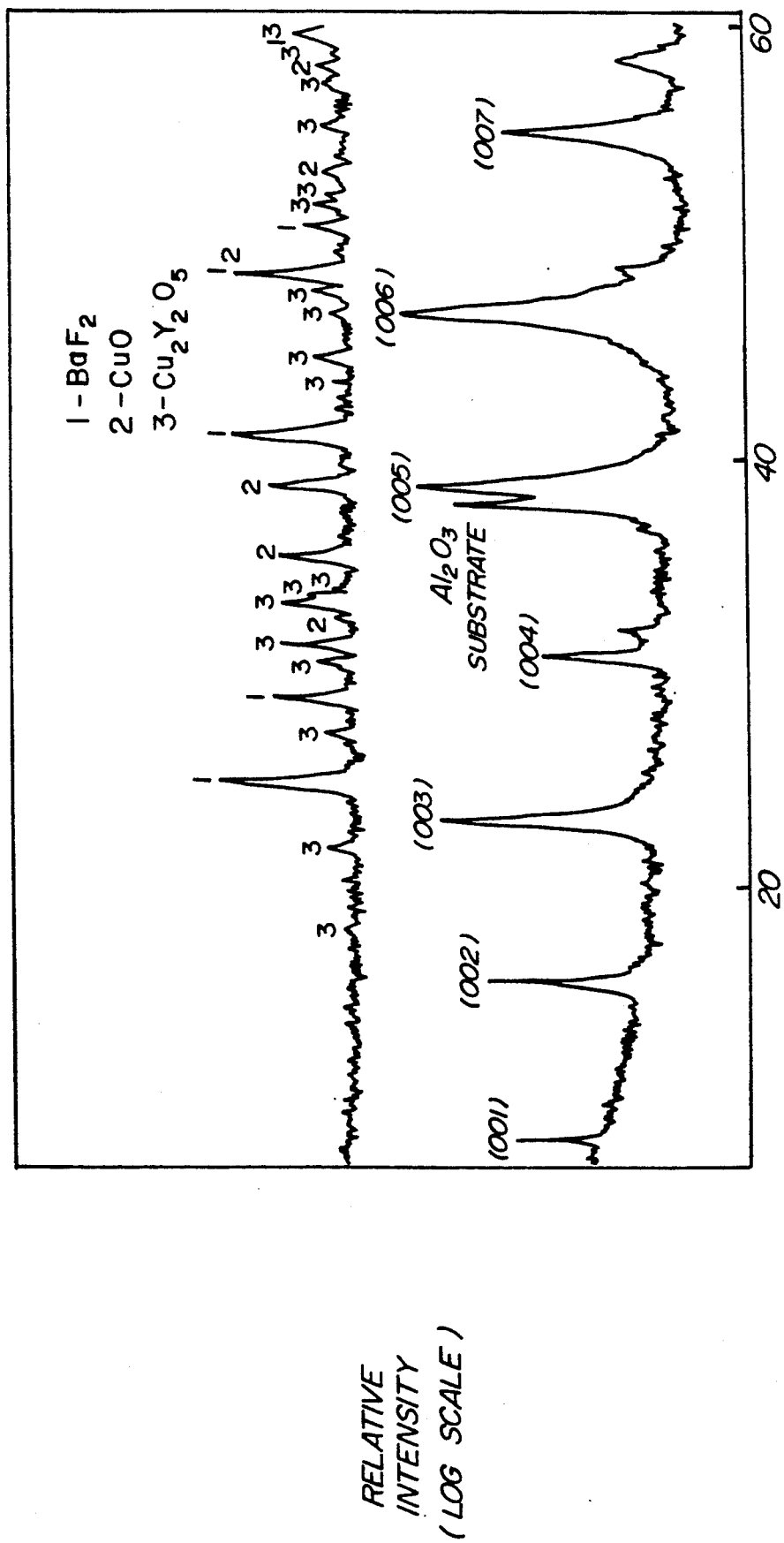
FIG. 2 is a graphic representation of Relative Intensity plotted on the ordinate verses Degrees Two Theta plotted on the abscissa; said representation showing the multiphasic nature of the target in the upper plot and the virtually single phasic nature of the substrate in the lower plot.

Referring now to the drawings and particularly to FIG. 2, there is illustrated the x-ray diffraction pattern of a fluorinated target pellet in the upper trace thereof. The multiphasic nature of the target pellet, which consists of $BaF_2$, $CuO$, and $Cu_2O_3$, is clearly seen from the diffraction data. The X-ray diffraction pattern of a laser ablated film from the fluorinated target is shown in the lower trace of FIG. 2. It is interesting to note that the superconducting film generated from the multiphasic target, which contains no superconducting phase, is virtually "single phase". Only the (00 diffraction peaks along with an $Al_2O_3$ substrate peak are detected. The two most intense diffraction peaks of a completely random diffraction such as (103) and (013)/(110) are hardly seen, indicating the c-axis of the fluorinated superconducting film is predominately normal to the basal plane of the substrate. Not surprisingly, the fluorine content in the film was small, being just beyond the detection limit of the electron microprobe, i.e., 0.1 atomic 3 percent. However, the presence of fluorine was clearly detected utilizing the SIMS technique. In this regard, note that a large percentage of the fluorine present in the target pellet is lost to the chamber during the laser ablation process. Nevertheless, the fluorinated superconducting films ablated from the fluorinated target pellet consistently show better electrical transport properties than those from a non-fluorinated single phase 123 target pellet. It is for this reason that the instant inventors conclude that fluorine is playing a major role in organizing film growth in the plasma as well as cleaning the surface of nucleation centers which would otherwise initiate columnar growth.

Figure 3:
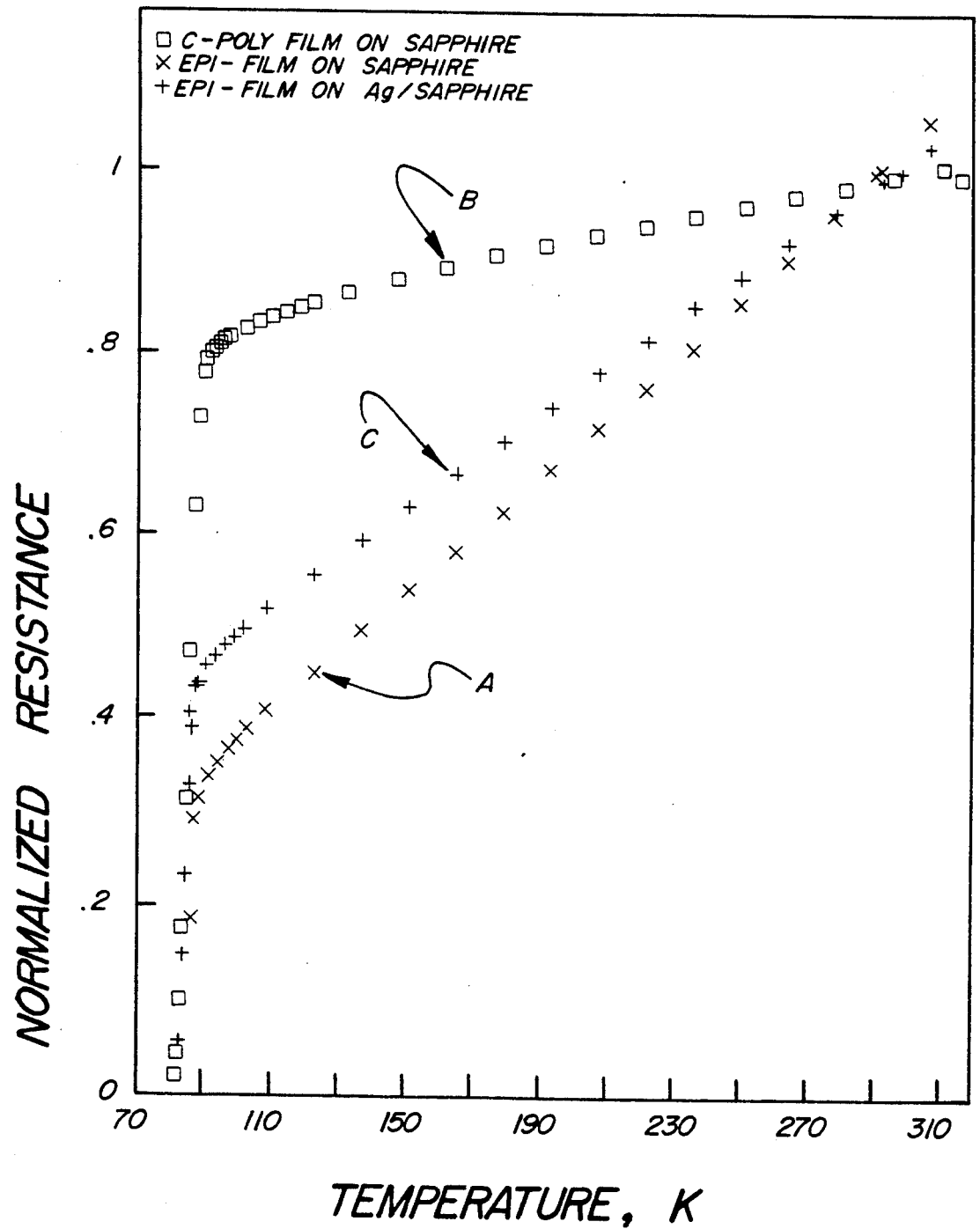
FIG. 3 is a graphic representation of Normalized Resistance plotted on the ordinate verses Temperature (in Kelvin) plotted on the abscissa; said representation comparing the normalized resistance of the fluorinated superconducting $YBa_2Cu_3O_7$ film of the present invention as laser ablated from a multiphase fluorinated target to the normalized resistance of a polycrystalline $YBa_2Cu_3O_7$ film deposited from a single phase non-fluorinated target.

FIG. 3 is a graphical comparison of the transition to the superconducting states of two laser ablated films. The fluorinated $YBa_2Cu_3O_7$ superconducting film was deposited from the multiphased fluorinated target pellet and the standard $YBa_2Cu_3O_7$ superconducting film was from a single phase non-fluorinated target pellet. The deposition conditions, under which all these films were deposited, were kept the same. The films were grown to about 0.3 micrometers thickness. The standard non-fluorinated $YBa_2Cu_3O_7$ superconducting film of reference arrow B showed an onset temperature of 88K and $T_c(R=0)$ at 82K, whereas the fluorinated $YBa_2Cu_3O_7$ film of reference arrows A and C showed an onset at 94K and $T_c(R=0)$ at least as high as 88K. Furthermore, the much steeper normal state resistivity-temperature slope of the fluorinated $YBa_2Cu_3O_7$ superconducting films of graphs A and C indicated superior metallic behavior. This steeper slope is known in the art to be the fingerprint of epitaxially grown superconducting films. Accordingly, the steep slope of the arrow C graph is proof that the film grown on a silver substrate is epitaxial.

Figure 7:
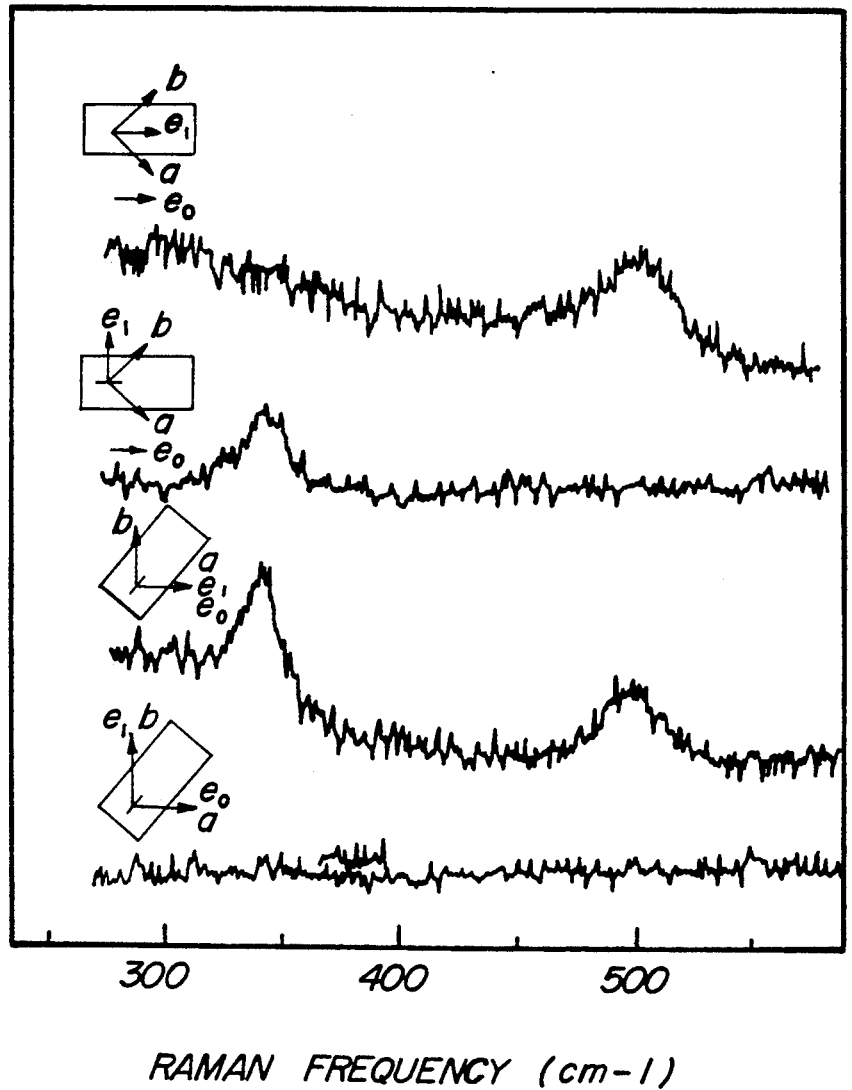
FIG. 7 is a graphic representation of Raman Spectroscopy Intensity plotted on the ordinate versus Raman Spectroscopy Frequency plotted on the abscissa for fluorinated $YBa_2Cu_3O_7$ superconducting film deposited on a sapphire-substrate to show the relationship of the a-b axis of the film versus the electric sector of incident and scattered radiation always lie in the basal plane of the unit cells of the superconducting film.

In FIG. 7 Raman spectroscopy was employed to investigate crystal structure and in-plane axes orientation. It is known that if the sample exhibits good crystal properties, the polarization of the scattered radiation can be analyzed subject to the selection rules which depend on the crystal structure. The polarization characteristics of the 500 $cm^{-1}$ and 335 $cm^{-1}$ Raman lines of the $Y_1Ba_2Cu_3O_7$ crystal can be used to determine whether the crystal axes are oriented and if so, the direction of that orientation. FIG. 7 shows a set of Raman spectra for the fluorinated $YBa_2Cu_3O_7$ superconducting film grown on sapphire pursuant to the aforementioned process. The electric vector of the incident ($E_i$) and scattered ($E_{sj}$) radiation are always in the basal plane of the superconducting film, which film is about 2000A thick, 4mm wide and 12mm long. The c-axis of the superconducting film is perpendicular to the basal plane of the substrate. As can be seen from FIG. 7, the 335 $cm^{-1}$ mode is completely absent in the (a) and (d) traces, whereas the 500 $cm^{-1}$ mode is absent in the (b) and (d) traces. These spectra exhibit the same polarization behavior as a single crystal, thereby further confirming that the growth of the laser ablated superconducting film is epitaxial-like. The a-b axes (the basal plane) of the film is definitely shown to be nearly 45° to the side of the substrate.

Figure 8:
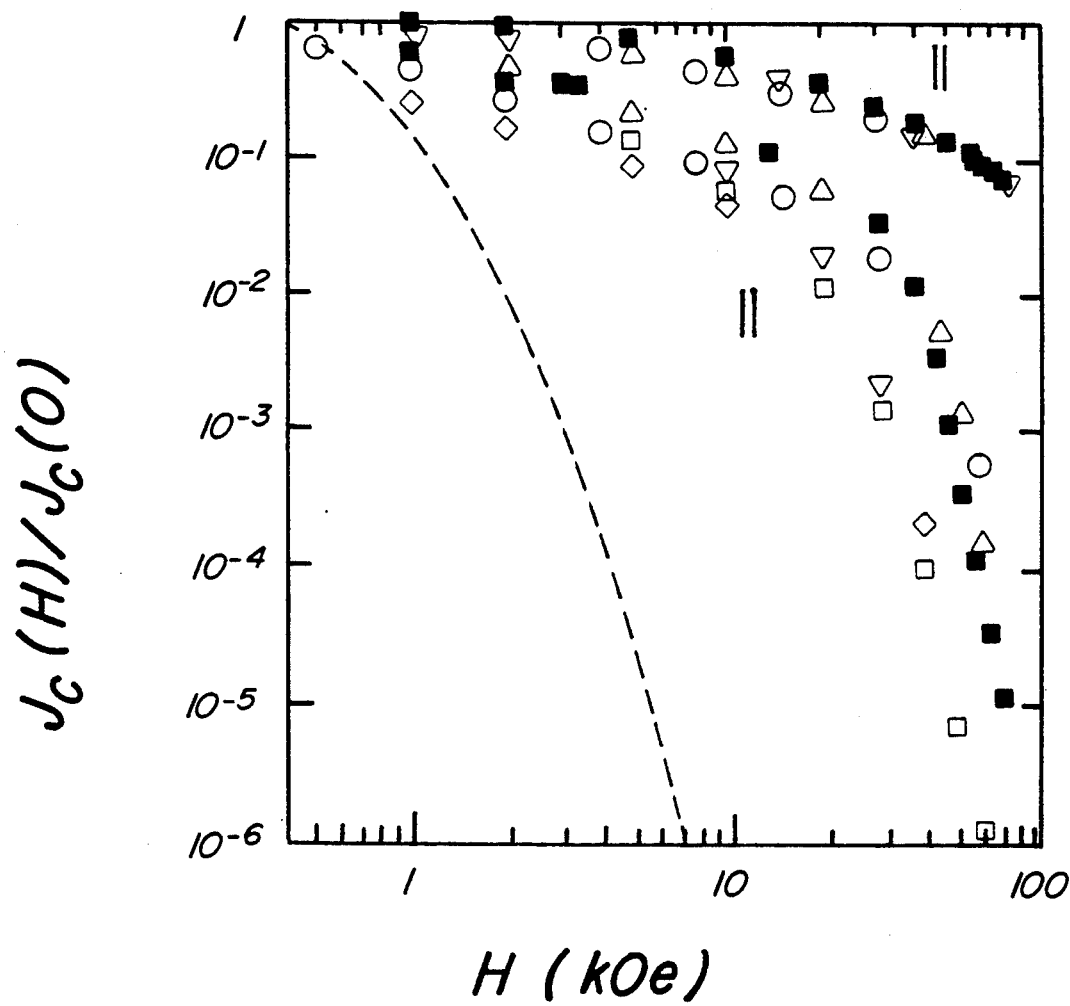
FIG. 8 is a graphic representation of magnetic field dependance of various superconducting films in which the ratio of Jc(H)/Jc(O) is plotted on the ordinate and H is plotted on the abscissa.

With reference to FIG. 8, the magnetic field dependence of the fluorinated $YBa_2Cu_3O_7$ superconducting film further confirmed the conclusion that the fluorinated superconducting film grown on a sapphire substrate is similar to the magnetic field dependence of an epitaxial film grown on $SrT_iO_3$. The data plot of magnetic field dependence of Jc on H of the fluorinated film on sapphire at 77K with H perpendicular to the film correlates to the plots of other superconducting films, such as SrT$_i$O$_3$ and LaAlO$_3$.

Figure 10:
FIG. 10 is a bright field TEM cross-sectional microphotograph of an as-deposited polycrystalline fluorinated $YBa_2Cu_3O_7$ superconducting film of the prior art and illustrating columnar crystalline growth and grain boundary resistance to high current conduction.

Once again it is essential to note that the superior electrical conductivity of the fluorinated YBa$_2$Cu$_3$O$_7$ superconducting film is attributed to the fact that the fluorine promotes epitaxial-like growth, whereas columnar growth is dominant in the non-fluorinated films. The bright field TEM images from the cross-sectional microphotographs of the standard YBa$_2$Cu$_3$O$_7$ superconducting film (FIG. 10) and the fluorinated YBa$_2$Cu$_3$O$_7$ superconducting film on sapphire (FIG. 9) clearly show this result. The conventional YBa$_2$Cu$_3$O$_7$ polycrystalline film includes columnar growth of discrete crystallites and sharp vertical grain boundaries. However, no such grain boundaries are present in the fluorinated YBa$_2$Cu$_3$O$_7$ epitaxial-like superconducting film. The surface morphology of the fluorinated epitaxial-like film provides a much smoother, indeed a mirror-like surface in which the absence of cracks provides proof of the strain-relief inherent in the process disclosed herein.

In summary, a high quality epitaxial-like ceramic defect oxide-type superconducting film can be reproducibility grown on sapphire, silver, stainless steel or any other substrate (regardless of lattice structure) by using a multiphase fluorinated target of Y, Ba, Cu and O. This growth process was totally unanticipated or predicted by the work of other scientists in the field. It is believed unquestionable but that fluorine plays the dominant role in promoting the "epitaxy". We suggest that the role of fluorine is to control the presence of nucleation centers, whether by etching or otherwise chemically neutralizing those centers, on the deposition surface and to enhance the growth of the superconducting film in the basal plane. Technologically, this finding is particularly important because with this approach the high T$_c$ superconducting film can be grown on any flexible metallic substrate, such as stainless steel and silver, which substrates are needed for high field applications. Importantly, the high quality fluorinated superconducting film is grown at relatively low temperature. As a result, the grain boundary weak link effect and the interfacial diffusion between the superconducting film and the substrate are minimized and a high critical current density is achieved. And all of the foregoing results are substrate independent, i.e., they are achieved without the need for a substrate lattice matched to the lattice of the superconducting material.

It is essential that one final point be made. As the reader can appreciate from a perusal of the "epitaxial-like" growth illustrated in FIG. 9 hereof, the scale is a relatively small one wherein one (1) inch is equal to about 0.05 microns (500 Angstroms). Therefore the width of the microphotographs reveals single crystal growth over about seven (7) inches or 3500 Angstroms. However, a laser scan of the surface, during Raman spectroscopy measurements, demonstrated that there was no visible end to the epitaxial growth. Indeed the scan showed a single crystal extending over a millimeter in length, the extent to which said laser could be moved. The conclusion to be drawn is that single crystallites of infinite length can be manufactured using the method of the instant invention.

While the instant invention has been described with respect to certain example and preferred embodiments, these examples and preferred embodiments are not intended to limit the scope of the invention; but rather, the instant invention should only be limited by the scope of the claims attached hereto and those equivalents thereof which would be obvious to those of ordinary skill in the art.

We therefore claim:

1. A method of fabricating a fluorinated Y$_1$Ba$_2$Cu$_3$O$_7$(F) superconducting thin film on a substrate having a lattice which does not match the lattice of superconducting film, said method including the steps of:
   providing a substrate characterized by a lattice differing from the lattice of the fluorinated Y$_1$Ba$_2$Cu$_3$O$_7$(F) superconducting thin film;
   providing at least one non-stoichiometric, fluorinated target including Y, Ba, Cu, and O;
   providing a chamber defining a deposition region therewithin;
   evacuating said chamber;
   providing a background atmosphere including at least a partial pressure of O$_2$ in said deposition region;
   heating said substrate;
   providing a laser;
   laser ablation depositing the fluorinated target material, in said background atmosphere, onto the heated substrate; and
   controlling said partial pressure of O$_2$ in said deposition region and the temperature of said substrate such that the fluorinated material deposited onto said heated substrate is superconducting without a post deposition oxygen anneal,
wherein a fluorinated Y$_1$Ba$_2$Cu$_3$O$_7$(F) superconducting thin film, characterized by basal plane alignment of the unit cells thereof and a lattice which is different than that of said substrate, is grown on said heated substrate.

2. The method of claim 1, wherein the step of providing a non-stoichiometric fluorinated target comprises providing a sintered, multiphased target including BaF$_2$, CuO and Y$_2$O$_3$.

3. The method of claim 1, wherein the step of providing a non-stoichiometric fluorinated target comprises providing a sintered body of Y$_1$Ba$_{2.7}$Cu$_{2.6}$O$_{4.1}$F$_{5.4}$ target material.

4. The method of claim 1, wherein the step of providing a partial pressure 0$_2$ atmosphere includes maintaining said atmosphere at a pressure in the range of about 25 to 50mTorr.

5. The method of claim 1, which includes the further step of mounting the substrate in a holder which is maintained at a temperature in the range of about 650° to 680° C.

6. The method of claim 1, wherein the step of providing at least one non-stoichiometric fluorinated target includes providing a plurality of spacedly disposed non-stoichiometric fluorinated targets; and said method further includes the step of simultaneously laser ablating material from said plurality of targets so as to uniformly deposit superconducting material onto large area substrates.

7. The method of claim 1, wherein the step of providing a substrate comprises the step of providing a Al$_2$O$_3$ substrate having a hexagonal lattice structure.

8. A method of sequentially fabricating a fluorinated Y$_1$Ba$_2$Cu$_3$O$_7$(F) superconducting thin film on substrates having a lattice which does not match the lattice of said superconducting film, said method including the steps of:

providing a plurality of substrates characterized by a lattice differing from the lattice of the fluorinated $Y_1Ba_2Cu_3O_7(F)$ superconducting thin film;

providing at least one non-stoichiometric, fluorinated target including Y, Ba, Cu, and O; providing a chamber defining a deposition region therewithin;

evacuating said chamber; providing a background atmosphere including at least a partial pressure of $O_2$ in said deposition region;

providing a means for sequentially advancing discrete ones of said substrates through said deposition region; heating said plurality of substrates;

providing a laser;

laser ablation depositing the fluorinated target material, in said background atmosphere, onto the heated substrates sequentially advance through said deposition region; and controlling said partial pressure of $O_2$ in said deposition region and the temperature of said substrate such that the fluorinated material deposited onto said heated substrate is superconducting without the need for a post deposition oxygen anneal, whereby a fluorinated $Y_1Ba_2Cu_3O_7(F)$ superconducting thin film, characterized by basal plane alignment of the unit cells thereof and a lattice which is different than that of said substrates, is sequentially grown on said discrete heated substrates.

9. The method of claim 8, wherein the step of providing a non-stoichiometric, fluorinated target includes providing a sintered, multiphased target including $BaF_2$, $CuO$ and $Y_2O_3$.

10. The method of claim 8, wherein the step of providing a non-stoichiometric, fluorinated target comprises providing a sintered body of $Y_1Ba_{2.7}Cu_{2.63}O_{4.1}F_{5.4}$ target material.

11. The method of claim 8, wherein the step of providing a partial pressure $O_2$ atmosphere includes maintaining said atmosphere at a pressure in the range of about 25 to 50 mTorr.

12. The method of claim 8, wherein the step of providing at least one non-stoichiometric fluorinated target includes providing a plurality of non-stoichiometric fluorinated targets; and said method includes a further step of simultaneously laser ablating material from said plurality of targets to uniformly and sequentially deposit superconducting material onto discrete ones of large area substrates advanced through the deposition region.

13. The method of claim 8, further including the step of introducing a plurality of substrates into the chamber.

14. The method of claim 13, further including the step of operatively disposing said substrates in spaced relation on a cassette.

15. The method of claim 14, further including the step of sequentially selecting a substrate and advancing said selected substrate through the deposition region.

16. The method of claim 8, including the further step of fabricating the substrate of sapphire.

17. The method of claim 16, further including the further step of depositing a layer of silver atop one surface of the sapphire substrate.

* * * * *